US009153567B2

(12) United States Patent
Saino

(10) Patent No.: US 9,153,567 B2
(45) Date of Patent: Oct. 6, 2015

(54) SEMICONDUCTOR DEVICE

(71) Applicant: PS4 LUXCO S.A.R.L., Luxembourg (LU)

(72) Inventor: Kanta Saino, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 93 days.

(21) Appl. No.: 13/899,916

(22) Filed: May 22, 2013

(65) Prior Publication Data

US 2014/0151791 A1 Jun. 5, 2014

(30) Foreign Application Priority Data

May 29, 2012 (JP) ................................ 2012-122288

(51) Int. Cl.
*H01L 27/088* (2006.01)
*H01L 27/02* (2006.01)
*H01L 27/108* (2006.01)

(52) U.S. Cl.
CPC ...... *H01L 27/0207* (2013.01); *H01L 27/10814* (2013.01); *H01L 27/10855* (2013.01); *H01L 27/10876* (2013.01); *H01L 27/10885* (2013.01); *H01L 27/10891* (2013.01); *H01L 27/10894* (2013.01)

(58) Field of Classification Search
CPC .............. H01L 27/088; H01L 27/0207; H01L 27/10814; H01L 27/10855; H01L 27/10894; H01L 27/10885; H01L 27/10891; H01L 27/10876

See application file for complete search history.

(56) References Cited

U.S. PATENT DOCUMENTS

| 2006/0273413 | A1* | 12/2006 | Sato et al. ..................... 257/411 |
| 2009/0189225 | A1* | 7/2009 | Hirase ........................... 257/369 |
| 2012/0080756 | A1 | 4/2012 | Suzuki et al. |
| 2012/0228678 | A1* | 9/2012 | Han ............................... 257/288 |
| 2013/0011989 | A1* | 1/2013 | Park et al. ...................... 438/381 |

FOREIGN PATENT DOCUMENTS

| JP | 2011-014689 | 1/2011 |
| JP | 2011-049282 | 3/2011 |

* cited by examiner

*Primary Examiner* — Hrayr A Sayadian

(57) ABSTRACT

A semiconductor device comprises: a memory cell region having a first transistor and a peripheral circuit region having a second transistor. The first transistor has a first source electrode and a first drain electrode, a first buried gate insulating film which is formed along an inner wall of a trench and whose relative dielectric constant is higher than a relative dielectric constant of silicon oxide, and a buried gate electrode. The second transistor has a second source electrode and a second drain electrode, a first on-substrate gate insulating film whose relative dielectric constant is higher than a relative dielectric constant of silicon oxide, and an on-substrate gate electrode. A first Hf content percentage, which is a content percentage of hafnium in the first buried gate insulating film, is different from a second Hf content percentage, which is a content percentage of hafnium in the first on-substrate gate insulating film.

20 Claims, 22 Drawing Sheets

FIG. 5
(A) 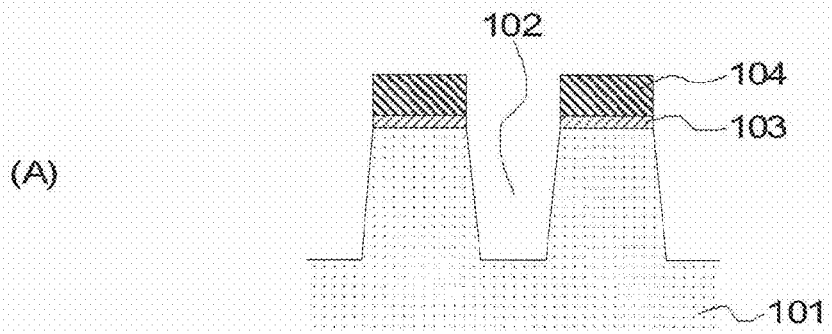
(B) 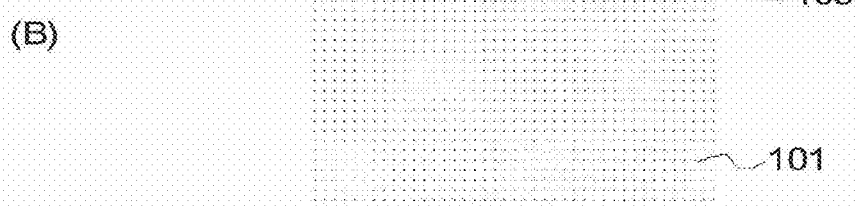
(C) 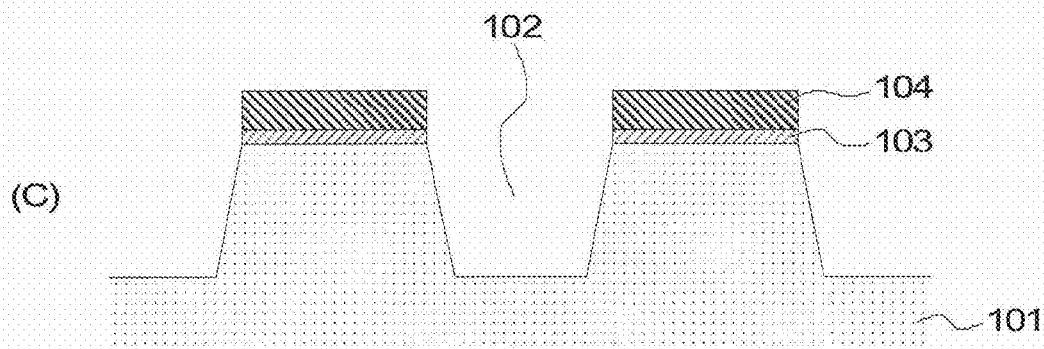

FIG. 7
(A) 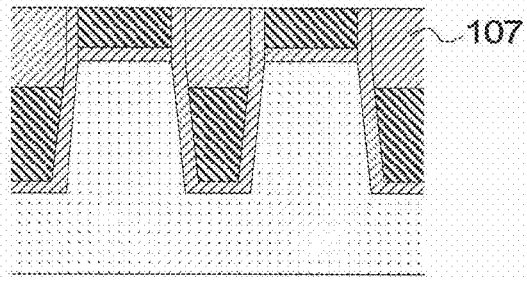 107
(B) 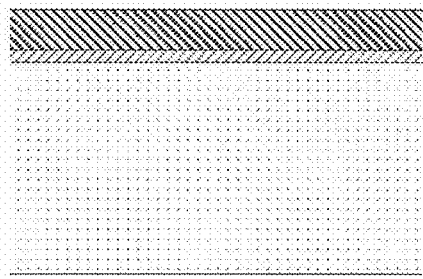
(C) 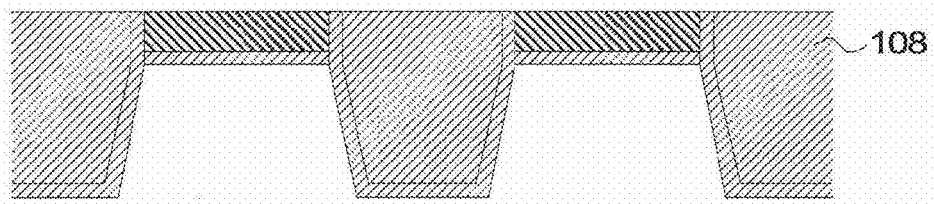 108

FIG. 9
(A)
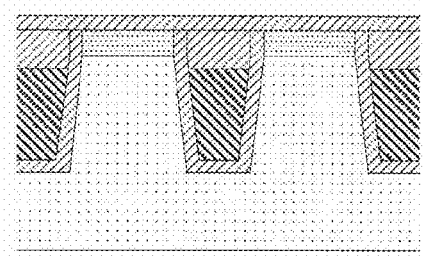
(B)
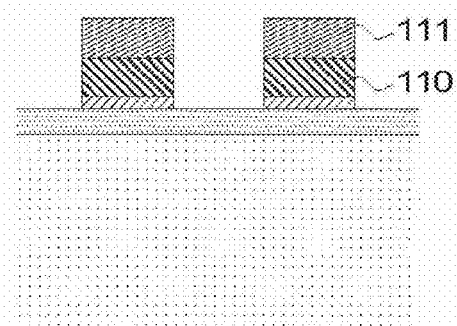
(C)
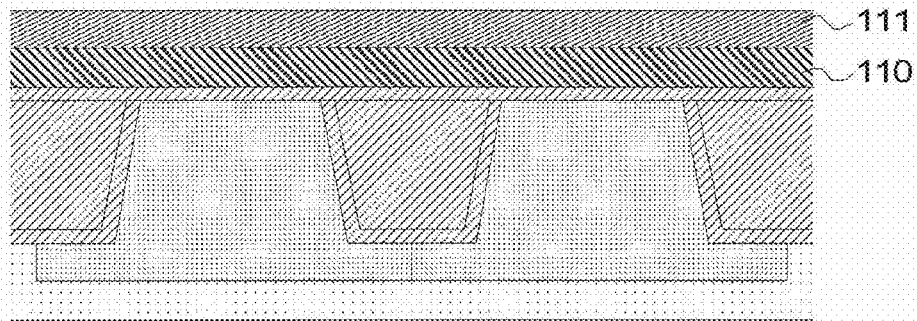

FIG. 10
(A) 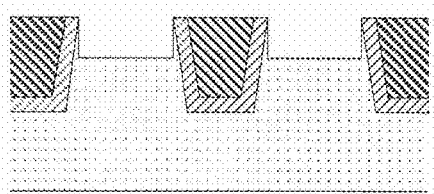
(B) 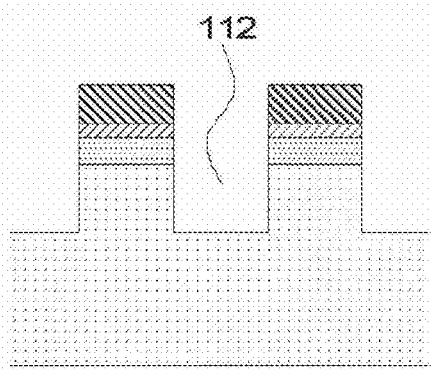
(C) 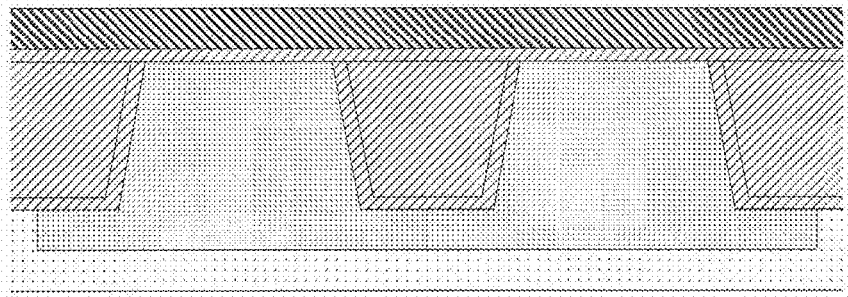

FIG. 12
(A) 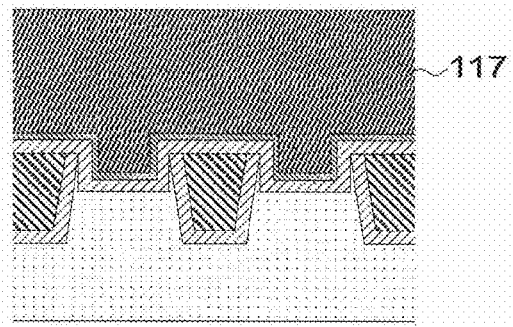
(B) 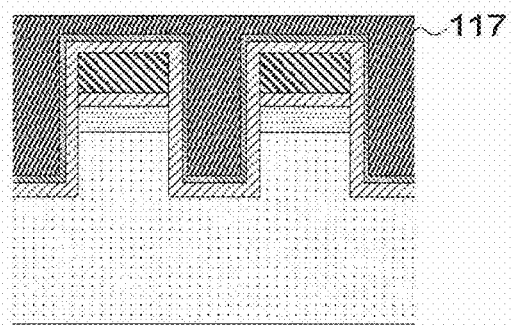
(C) 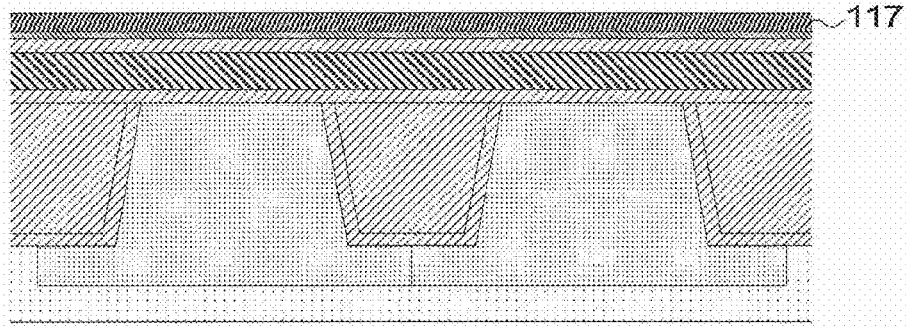

FIG. 13
(A) 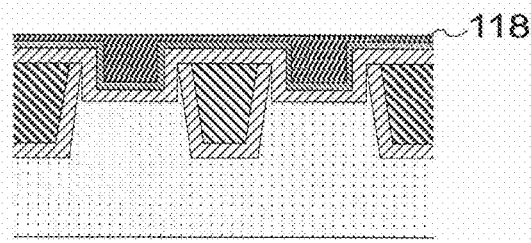
(B) 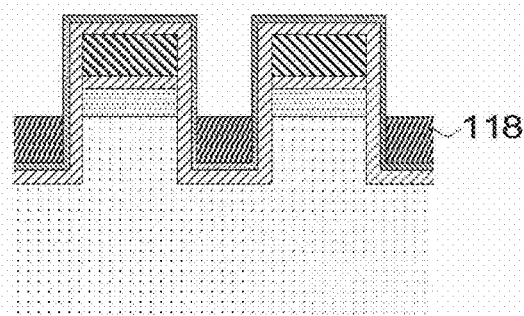
(C) 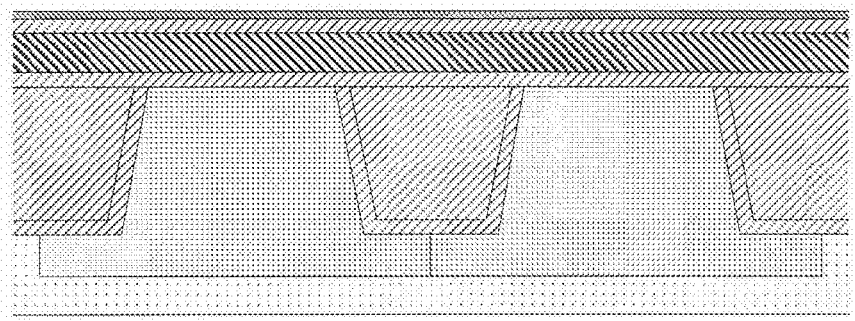

FIG. 14
(A) 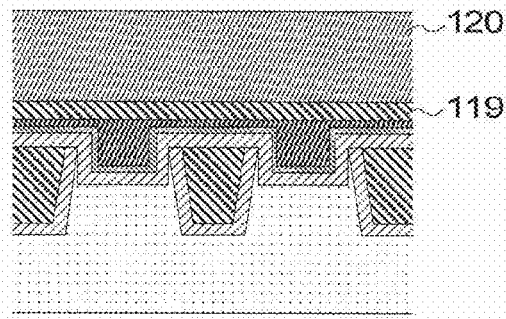
(B) 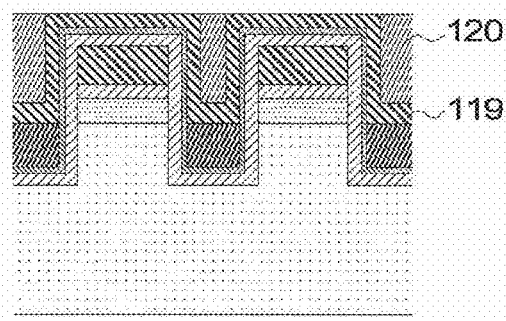
(C) 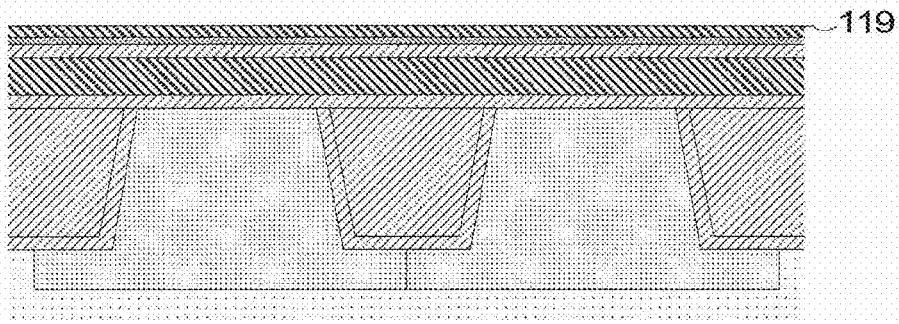

FIG. 15
(A) 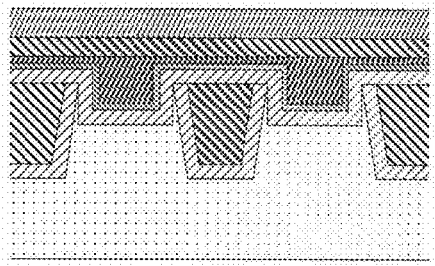
(B) 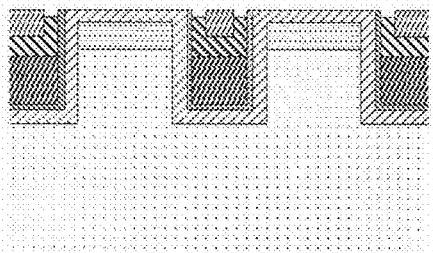
(C) 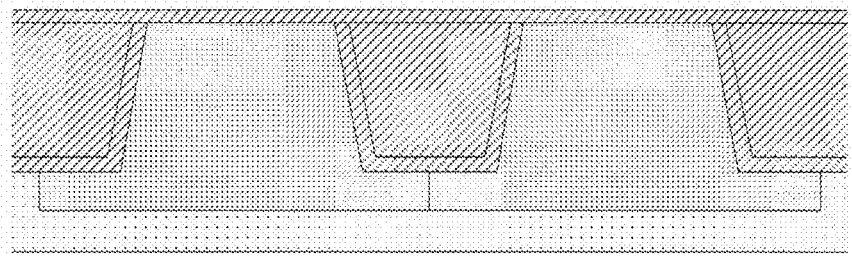

FIG. 16
(A) 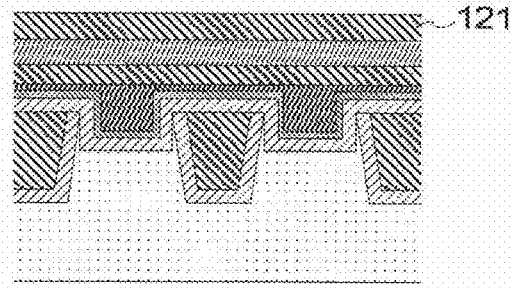
(B) 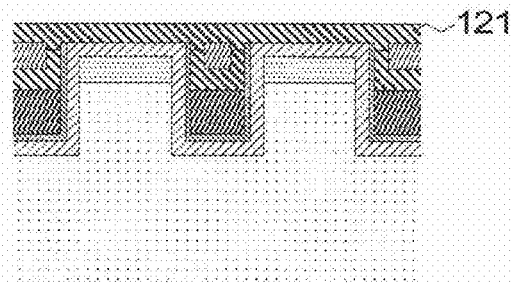
(C) 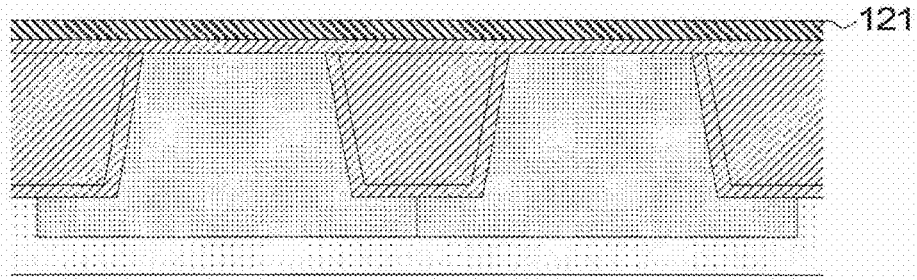

FIG. 17
(A) 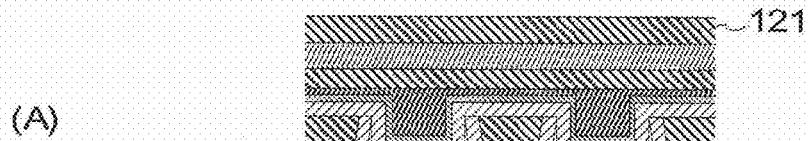
(B) 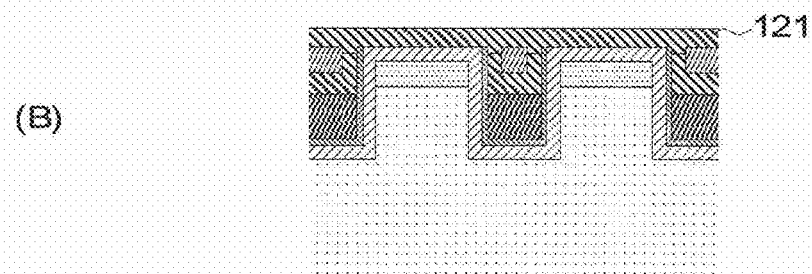
(C) 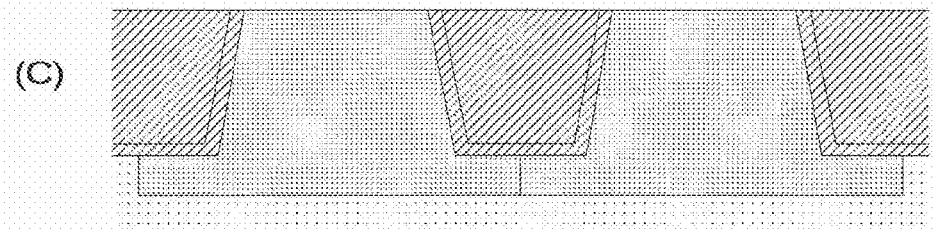

FIG. 19
(A) 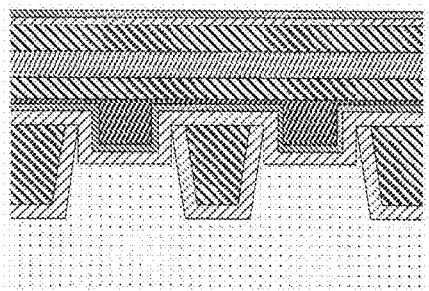
(B) 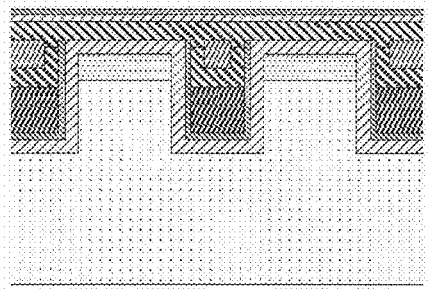
(C) 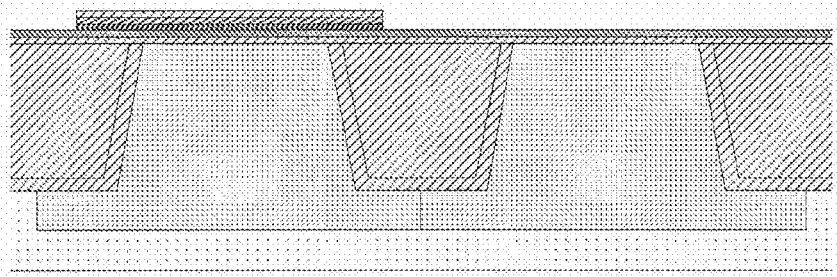

FIG. 20
(A) 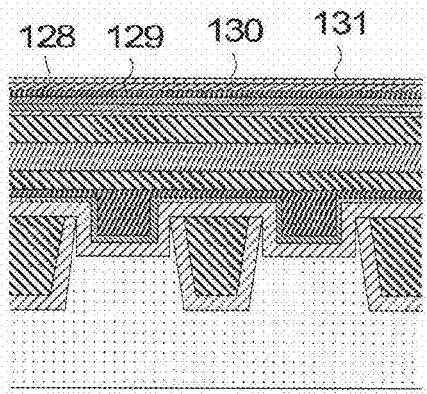
(B) 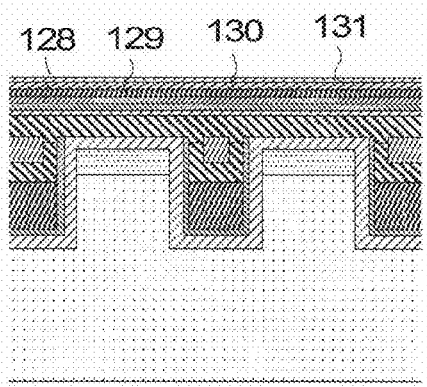
(C) 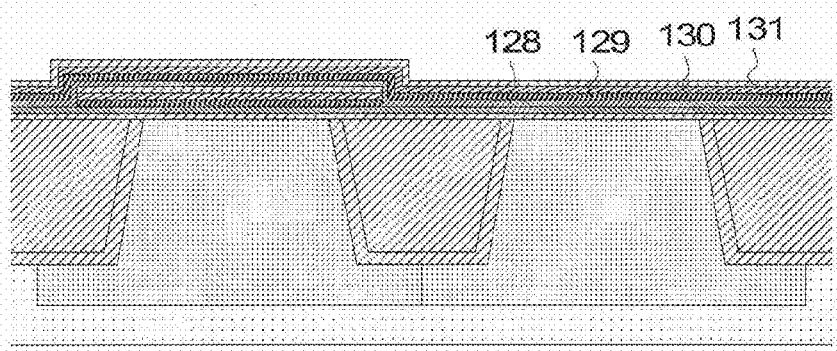

FIG. 21
(A)
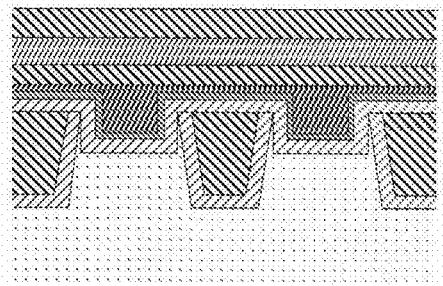
(B)
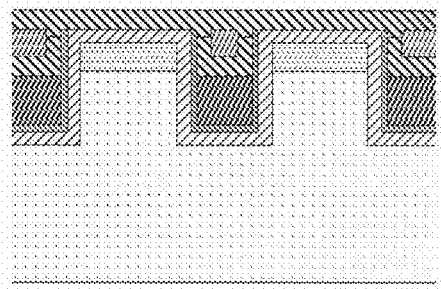
(C)
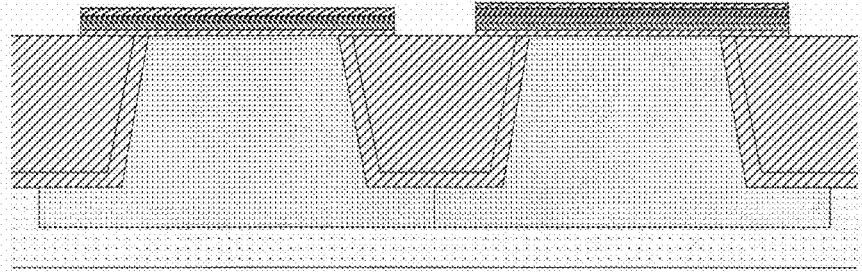

FIG. 22
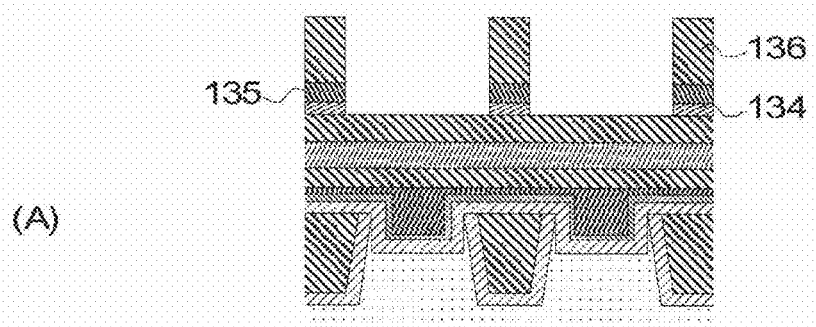
(A)
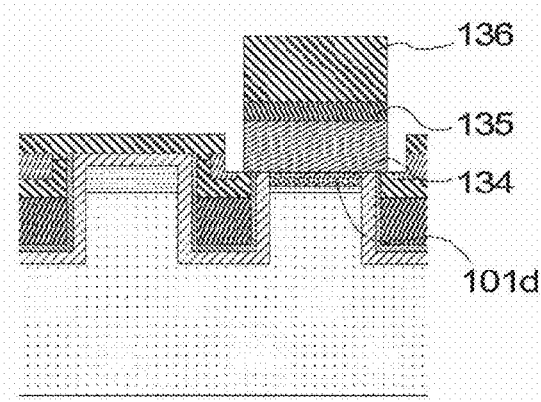
(B)
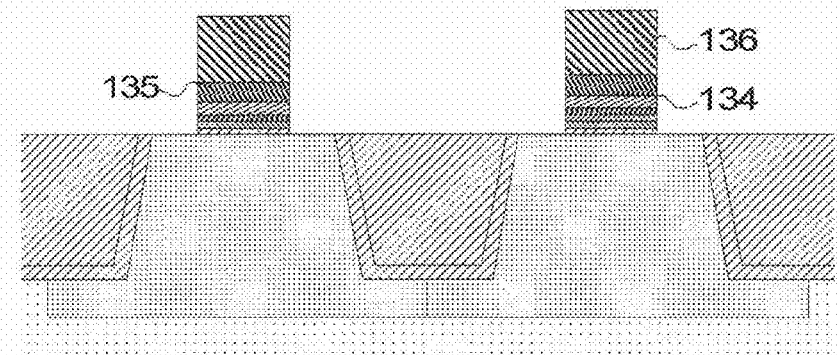
(C)

SEMICONDUCTOR DEVICE

REFERENCE TO RELATED APPLICATION

The present disclosure is based upon the priority of Japanese patent application No. 2012-122288, filed on May 29, 2012, the disclosure of which is incorporated herein in its entirety by reference thereto.

TECHNICAL FIELD

The present disclosure relates to a semiconductor device which uses high-k [high-dielectric constant] materials as a gate insulating film.

BACKGROUND

It is necessary to suppress a gate leak current, and to decrease EOT (Equivalent Oxide Thickness) to develop a technological advance and microfabrication in transistors of semiconductor devices such as DRAM. Therefore, the semiconductor devices using high-dielectric constant materials (High-k materials) as a gate insulating film are developed (for example, refer to JP Patent Kokai Publication No. JP-P2011-14689A (Patent Literature 1) which corresponds to US2012/080756A1 and JP Patent Kokai Publication No. JP-P2011-49282A (Patent Literature 2)).

A semiconductor device which is described in Patent Literature 1 is provided with a high dielectric gate insulating film which is formed on a substrate and a metal gate electrode which is formed on the high dielectric gate insulating film, and a halogen segregates on a metal gate electrode side at an interface between the high dielectric gate insulating film and the metal gate electrode.

In a semiconductor device which is described in Patent Literature 2, a gate structure having a high dielectric constant film and a metal gate electrode is formed on a semiconductor substrate in a MONOS memory forming area and a MISFET area.

SUMMARY

The following analyses are given according to the views of the present disclosure.

If a thickness of a gate insulating film which has a low relative dielectric constant such as a silicon oxide film be increased, this will acts against a trend of the microfabrication of semiconductor devices, EOT will increase, and an on-electric current will decrease. On the other hand, with the miniaturization of the semiconductor device, a gate leak current will increase if a gate insulating film having the low relative dielectric constant be thinned. Therefore it is necessary to use a gate insulating film having a high relative dielectric constant in order to suppress a gate leak current and increase on-electric current. However, high dielectric constant materials such as hafnium oxide ($HfO_2$) are thermally unstable materials in comparison with silicon oxide ($SiO_2$), and a compound containing hafnium (hereinafter referred to as "hafnium-containing compound".) such as hafnium oxide is crystallized by the heat-treatment of a comparatively low temperature in a process of manufacture. Particularly, the more the relative dielectric constant of the high dielectric material increases, the more the crystallization temperature lowers. When the high dielectric material in the gate insulating film crystallizes, a threshold voltage cannot be controlled or becomes easy to vary. Furthermore, hafnium oxide becomes easy to react with the metal gate electrode and silicon substrate, and the leak current increases. Furthermore, there arise problems that cause reliability degradation of the gate insulating film.

In the technique described in Patent Literature 2, in order to prevent the degradation of the high dielectric material caused by the heat treatment for activation of source/drain regions, a dummy gate electrode is formed, followed by forming the source/drain regions and removing the dummy gate electrode, then the high dielectric constant gate insulating film and the metal gate electrode are formed on the semiconductor substrate. However, as described below, this method can not be applied to a manufacturing process of a semiconductor device having a buried word line.

In the manufacturing process of the semiconductor device having the buried word line, a gate structure of a memory cell region is formed prior to that of a peripheral circuit region. That is, when the high dielectric constant gate insulating film containing the hafnium-containing compound is formed in both of the peripheral circuit region and the memory cell region, the semiconductor substrate is exposed in the peripheral circuit region, and the gate insulating film (interface layer) of a silicon oxide film is formed in the peripheral circuit region by thermal oxidation after the buried word line using the high dielectric constant gate insulating film is formed in the memory cell region. Then, the gate structure having the high dielectric constant gate insulating film and the metal gate electrode is formed on the interface layer. However, at the time of the heat-treatment to form the interface layer, since the high dielectric constant gate insulating film has been already formed in the memory cell region, this heat-treatment incurs a thermal load on the high dielectric constant gate insulating film in the memory cell region. And, by this thermal load, the hafnium-containing compound crystallizes in the high dielectric constant gate insulating film of the memory cell region, and the problems in the thinning of the equivalent gate oxide thickness, the increase of the gate leak current and the rise of the threshold voltage occur, resulting in a decrease in the on-electric current of the memory cell region. And, by this thermal load, the hafnium-containing compound crystallizes in the high dielectric constant gate insulating film of the memory cell region, the problems such as the increase in the gate leak current, the uncontrollability of the threshold voltage, and the reliability degradation occurs.

According to a first aspect of the present disclosure, there is provided a semiconductor device comprising a memory cell region having a first transistor, and a peripheral circuit region which is formed around the memory cell region and has a second transistor on a semiconductor substrate. The first transistor has a first source electrode and a first drain electrode which are formed on the semiconductor substrate, a first buried gate insulating film which is formed along an inner wall of a trench formed in the semiconductor substrate between the first source electrode and the first drain electrode and whose relative dielectric constant is higher than a relative dielectric constant of silicon oxide, and a buried gate electrode which is formed in the trench on the first buried gate insulating film, comprises metal and functions as a word line. The second transistor has a second source electrode and a second drain electrode which are formed on the semiconductor substrate, a first on-substrate gate insulating film which is formed on a surface of the semiconductor substrate between the second source electrode and the second drain electrode and whose relative dielectric constant is higher than a relative dielectric constant of silicon oxide, and an on-substrate gate electrode which is formed on the first on-substrate gate insulating film and comprises metal. The first buried gate insulating film and the first on-substrate gate insulating film comprise a compound containing hafnium. A first Hf content percentage, which is a content percentage of hafnium in the first buried gate insulating film, is different from a second Hf content percentage, which is a content percentage of hafnium in the first on-substrate gate insulating film.

According to a second aspect of the present disclosure, there is provided a semiconductor device comprising a first transistor and a second transistor on a semiconductor substrate. The first transistor includes a first gate insulating film which is formed along an inner wall of a trench formed in the semiconductor substrate and whose relative dielectric constant is higher than a relative dielectric constant of silicon oxide, and a first gate electrode which is buried in the trench and formed on the first gate insulating film, and comprises metal. The second transistor includes a second gate insulating film which is formed on a most upper surface of the semiconductor substrate and whose relative dielectric constant is higher than a relative dielectric constant of silicon oxide, and a second gate electrode which is formed on the second gate insulating film and comprises metal. The first gate insulating film and the second gate insulating film comprise a compound containing hafnium (hereinafter referred to as "hafnium-containing compound".). A first Hf content percentage, which is a content percentage of hafnium in the first gate insulating film, is different from a second Hf content percentage, which is a content percentage of hafnium in the second gate insulating film.

BRIEF DESCRIPTION OF THE DRAWINGS

FIG. 5 a schematic flowchart to explain a method for manufacturing a semiconductor device according to a first exemplary embodiment of the present disclosure.

FIG. 7 is a schematic flowchart to explain a method for manufacturing a semiconductor device according to a first exemplary embodiment of the present disclosure.

FIG. 9 is a schematic flowchart to explain a method for manufacturing a semiconductor device according to a first exemplary embodiment of the present disclosure.

FIG. 10 is a schematic flowchart to explain a method for manufacturing a semiconductor device according to a first exemplary embodiment of the present disclosure.

FIG. 12 is a schematic flowchart to explain a method for manufacturing a semiconductor device according to a first exemplary embodiment of the present disclosure.

FIG. 13 is a schematic flowchart to explain a method for manufacturing a semiconductor device according to a first exemplary embodiment of the present disclosure.

FIG. 14 is a schematic flowchart to explain a method for manufacturing a semiconductor device according to a first exemplary embodiment of the present disclosure.

FIG. 15 is a schematic flowchart to explain a method for manufacturing a semiconductor device according to a first exemplary embodiment of the present disclosure.

FIG. 16 is a schematic flowchart to explain a method for manufacturing a semiconductor device according to a first exemplary embodiment of the present disclosure.

FIG. 17 is a schematic flowchart to explain a method for manufacturing a semiconductor device according to a first exemplary embodiment of the present disclosure.

FIG. 19 is a schematic flowchart to explain a method for manufacturing a semiconductor device according to a first exemplary embodiment of the present disclosure.

FIG. 20 is a schematic flowchart to explain a method for manufacturing a semiconductor device according to a first exemplary embodiment of the present disclosure.

FIG. 21 is a schematic flowchart to explain a method for manufacturing a semiconductor device according to a first exemplary embodiment of the present disclosure.

FIG. 22 is a schematic flowchart to explain a method for manufacturing a semiconductor device according to a first exemplary embodiment of the present disclosure.

PREFERRED MODES

Figure 1:
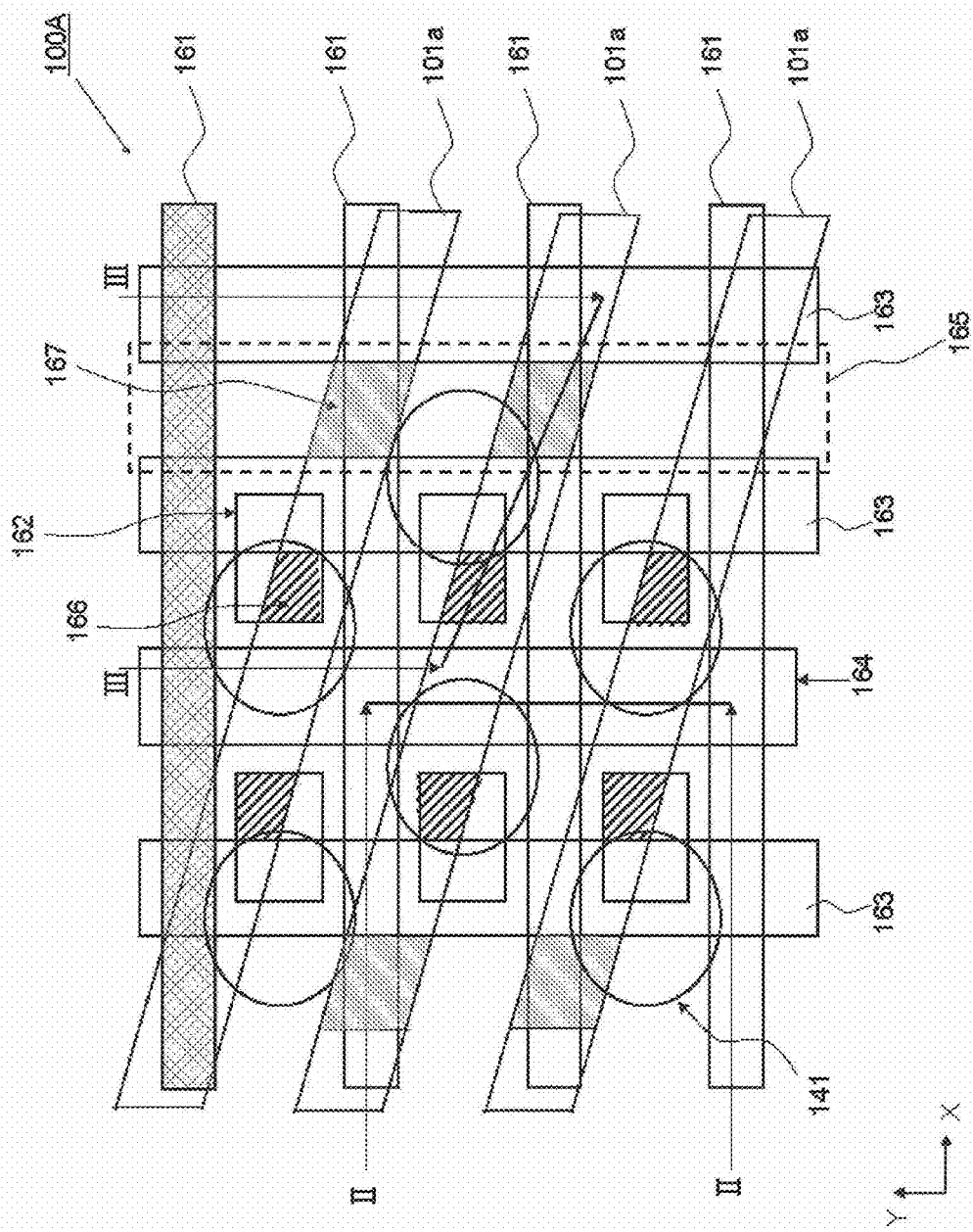
FIG. 1 is a schematic plan view of a memory cell region in a semiconductor device according to a first exemplary embodiment of the present disclosure.
Figure 2:
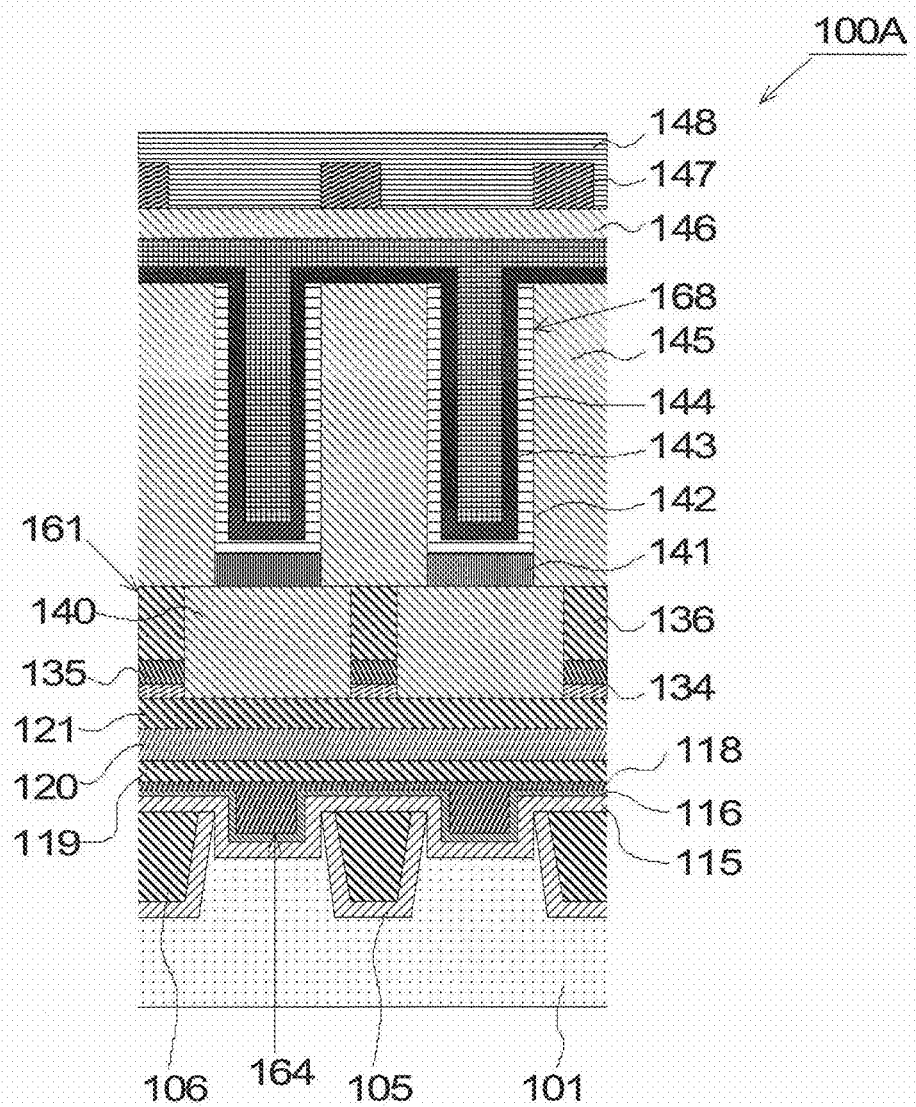
FIG. 2 is a schematic cross-sectional view of a memory cell region in a semiconductor device according to a first exemplary embodiment of the present disclosure.
Figure 3:
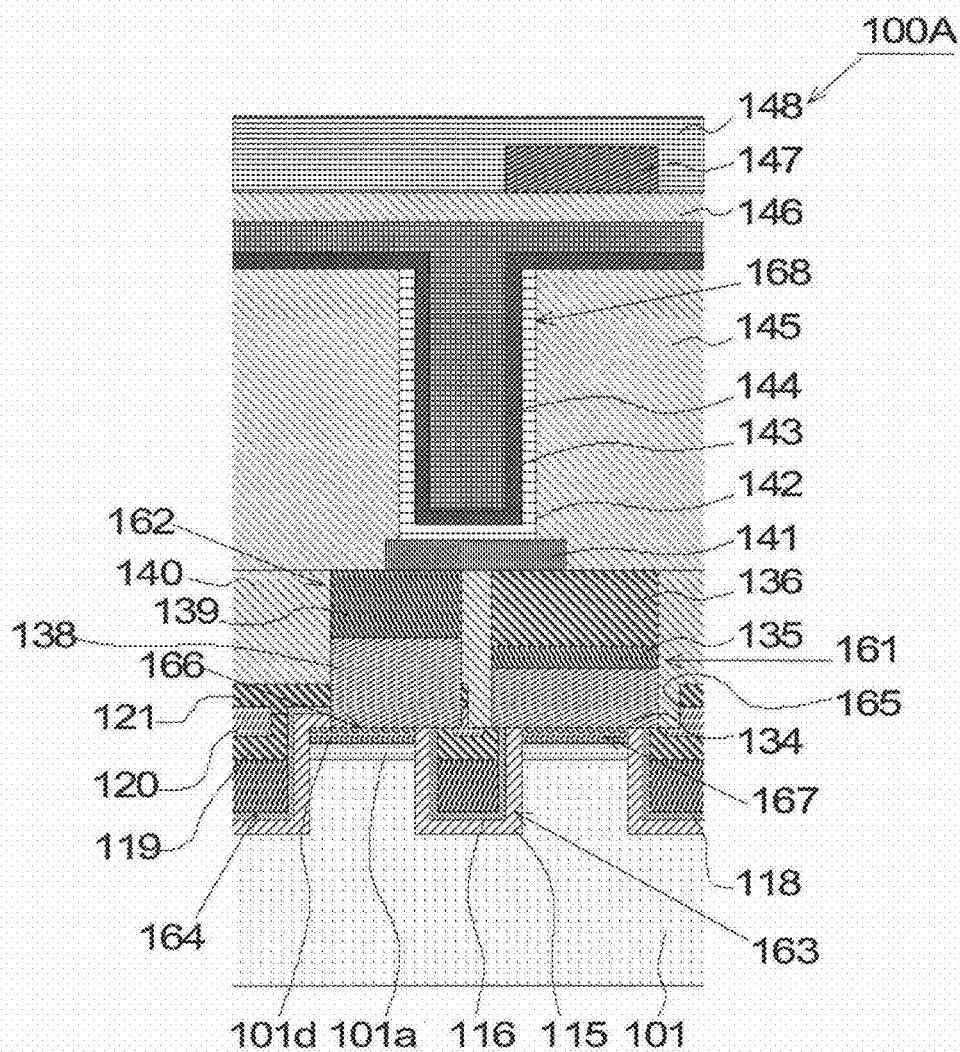
FIG. 3 is a schematic cross-sectional view of a memory cell region in a semiconductor device according to a first exemplary embodiment of the present disclosure.
Figure 4:
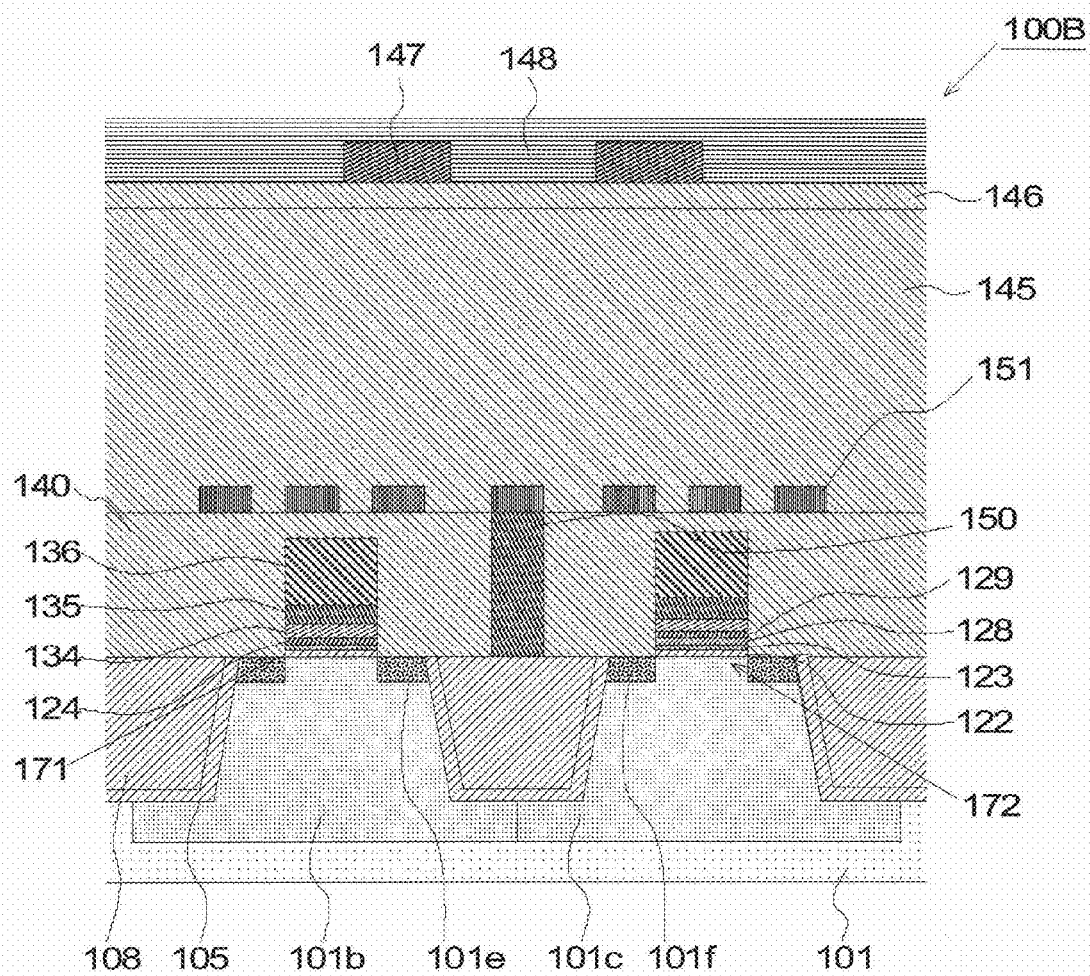
FIG. 4 is a schematic cross-sectional view of a peripheral circuit region in a semiconductor device according to a first exemplary embodiment of the present disclosure.

It is explained a semiconductor device according to a first exemplary embodiment of the present disclosure with DRAM as an example. The semiconductor device has a memory cell region 100A and a peripheral circuit region 100B. FIG. 1 shows a schematic plan view of the memory cell region in the semiconductor device according to the first exemplary embodiment of the present disclosure. In FIG. 1, a part of elements is/are illustrated. FIG. 1 is a drawing to make positional relations among the elements clear, and each element is made transparence. Furthermore, some elements in FIG. 1 are hatched for clarification. FIG. 2 and FIG. 3 show schematic cross-sectional views of the memory cell region in the semiconductor device according to the first exemplary embodiment of the present disclosure. FIG. 2 is the schematic cross-sectional view taken along a line II-II of FIG. 1. FIG. 3 is the schematic cross-sectional view taken along a line III-III of FIG. 1. FIG. 4 shows a schematic cross-sectional view of the peripheral circuit region in the semiconductor device according to the first exemplary embodiment of the present disclosure. In addition, in FIG. 2 through FIG. 4, the elements such as a stopper film and a side wall are not illustrated. Furthermore, in the following explanation, reference signs of the drawings are added for helping better understanding of the disclosure, without intention to limit to the illustrated modes.

At first the memory cell region 100A is explained. The memory cell region 100A has a plurality of bit lines 161, and a plurality of word lines 163 and a buried wiring 164 for element isolation which are at right angles to the bit lines 161, and a plurality of active regions (impurity diffusion layers) 101a which extend so as to intersect the bit the lines 161 and the word lines 163, and impurity high concentration diffusion layers 101d which are formed on both sides of the word line 163 of the semiconductor substrate 101 and serve as a first source electrode and a first drain electrode.

The word line 163 is a buried gate electrode which is buried in a groove formed in the semiconductor substrate 101. The word line 163 has a second buried gate insulating film 115 which covers an inner wall of the groove formed in the semiconductor substrate 101, a first buried gate insulating film 116 which is laminated on the second buried gate insulating film 115, and a first metal gate electrode 118 which is formed on the first buried gate insulating film 116 and is buried in at least part of the groove.

As the second buried gate insulating film 115, for example, a silicon oxide film or a silicon oxynitride film can be used.

For a material of the first buried gate insulating film 116, a material having a higher relative dielectric constant than that of silicon oxide is used. As the first buried gate insulating film 116, a material containing hafnium, such as hafnium silicate ($Hf_xSi_yO_z$, $Hf_xSi_yO_zN_w$) may be used. It is preferred that a first Hf content percentage, which is a content percentage of Hf in the first buried gate insulating film 116, (=[the number of hafnium atoms per one molecule of hafnium-containing compound]/([the number of hafnium atoms per one molecule of hafnium-containing compound]+[the number of silicon atoms per one molecule of hafnium-containing compound])× 100) is a content percentage of Hf that does not cause crystallization by heat treatment (heat treatment when an oxide film is formed (e.g., 700 degrees Celsius to 1,200 degrees Celsius)) in a manufacturing process. For example, it is preferred that the first content percentage of Hf in the first buried gate insulating film 116 is 10 atm % to 90 atm %. When the first content percentage of Hf is not less than 10 atm %, while suppressing the gate leakage, the thinner equivalent oxide thickness can be achieved. On the other hand, the hafnium-containing compound crystallizes in the oxidation treatment of the process when the first content percentage of Hf is beyond 90 atm %. Considering relation between easiness of the crystallization and securing of the EOT, from the viewpoint of prevention of the leak current, it is preferred that the first content percentage of Hf is not less than 20 atm %, and preferably not less than 40 atm %. And it is preferred that the first content percentage of Hf is not more than 80 atm %, and preferably not more than 60 atm %. In the present disclosure, for example, the Hf content percentage of the insulating film can be measured by using X-rays photoelectron spectroscopy (XPS).

It is preferred that for a film thickness of the first buried gate insulating film 116 is 1 nm to 3.5 nm from the viewpoint of prevention of the crystallization.

As a material of the first metal gate electrode 118, for example, titanium nitride (TiN), tungsten nitride (WN), tungsten (W) and so on can be used.

In FIG. 3, a first exposed part 166 and a second exposed part 167, which expose the high-concentration impurity diffusion layer 101d of the semiconductor substrate 101 from insulating films such as the second buried gate insulating film 115 covering the semiconductor substrate 101, are formed on both sides of the word line 163. In the first exposed part 166, a contact plug 162 is electrically connected to the high-concentration impurity diffusion layer 101d. In the mode shown in FIG. 3, the contact plug 162 has a fourth polysilicon film 138 which is formed on the high-concentration impurity diffusion layer 101d, and a second conductive film 139 which is laminated on the fourth polysilicon film 138. The contact plug 162 is also electrically connected to a contact pad 141. The contact pad 141 is formed on the second conductive film 139. In the second exposed part 167 which is exposed from an opening 165 formed on a region between adjacent word lines 163, the bit line 161 is electrically connected to the high-concentration impurity diffusion layer 101d. In the mode shown in FIG. 3, the bit line 161 has a third polysilicon film 134 which is formed on the high-concentration impurity diffusion layer 101d, and a first conductive film 135 which is laminated on the third polysilicon film 134. A third insulating film 136 such as a silicon nitride film lies between the first conductive film 135 and the contact pad 141. A first interlayer insulating film 140 exists around the bit line 161 and contact plug 162.

A capacitor 168 is connected on the contact pad 141. The capacitor 168 is formed in a second interlayer insulating film 145. The capacitor 168 has a lower electrode 142 which is formed into a pipe shape, a dielectric film 143 which coats an inner wall of the lower electrode 142, and an upper electrode 144 buried on the dielectric film 143.

A third interlayer insulating film 146 is formed on the capacitor 168. An upper wiring 147 is formed on the third interlayer insulating film 146. The upper wiring 147 is coated with a protective film 148.

Then, the peripheral circuit region 100B is explained. In the peripheral circuit region 100B, a p well 101b and n well 101c are formed in the semiconductor substrate 101, and an n-type impurity diffusion layer 101e is formed in the p well 101b, and a p-type impurity diffusion layer 101f is formed in the n well 101c. A first transistor 171 is formed in the p well 101b, and a second transistor 172 is formed in the n well 101c.

The first transistor 171 has an n-type impurity diffusion layer 101e which serves as the source electrode and the drain electrode, and a third on-substrate gate insulating film 122 such as a silicon oxide film and so on, a first on-substrate gate insulating film 123 which is laminated on the third on-substrate gate insulating film 122, and a second metal gate film 124 which is laminated on the first on-substrate gate insulating film 123. The second transistor 172 has a p-type impurity diffusion layer 101f which serves as the source electrode and the drain electrode, the third on-substrate gate insulating film 122 such as the silicon oxide film and so on, the first on-substrate gate insulating film 123 which is laminated on the third on-substrate gate insulating film 122, a second on-substrate gate insulating film 128 which is laminated on the first on-substrate gate insulating film 123, and a third metal gate film 129 which is laminated on the second on-substrate gate insulating film 128.

On the metal gate films 124 and 129 on the first transistor 171 and the second transistor 172, a third polysilicon film 134, the first conductive film 135 and the third insulating film 136 are laminated.

As materials of the first on-substrate gate insulating film 123 and the second on-substrate gate insulating film 128, materials having a higher relative dielectric constant than that of silicon oxide are used. As the first on-substrate gate insulating film 123, hafnium containing materials such as hafnium oxide ($HfO_2$, HfON), hafnium silicate (HfSiO, HfSiON) and so on may be used. And, as the second on-substrate gate insulating film 128, $Al_2O_3$ may be used, for example. It is possible to lower the voltage by forming the second on-substrate gate insulating film 128.

It is preferred that a second Hf content percentage, which is a content percentage of Hf in the first on-substrate gate insulating film 123, and a thickness of the hafnium-containing compound are determined so that the crystallization of hafnium-containing compound is not caused by heat treatment in a manufacturing process, particularly by heat treatment at the time of formation for the gate stack of the peripheral circuit region. Since in the heat-treatment after the formation of the transistor of the peripheral circuit region, temperature is lower or time is shorter than that of the heat-treatment that is necessary for the formation of the third on-substrate insulating film, the Hf content can be raised than that of the first buried insulating film of the memory cell region.

On the other hand, from the viewpoint of the equivalent oxide thickness, it is preferred that the second Hf content percentage of the first on-substrate gate insulating film 123 is different from the first Hf content percentage of the first buried gate insulating film 116 in the memory cell region 100A, and preferably higher than the first Hf content percentage. Furthermore, it is more preferred that the second Hf content percentage is higher than the first Hf content percentage by 10 atm % or more. For example, when the first Hf content percentage in the first buried gate insulating film 116 in the memory cell region 100A is 50 atm %, the second Hf content percentage of the first on-substrate gate insulating film 123 in the peripheral circuit region 100B can be set to 60 atm %. And, when the first Hf content percentage in the first buried gate insulating film 116 in the memory cell region 100A is 60 atm %, the second Hf content percentage of the first on-substrate gate insulating film 123 in the peripheral circuit region 100B can be set to 100 atm %. But, it is necessary that the film thickness is determined so that the hafnium-containing compound does not crystallize. By doing this way, the EOT of the transistor of the peripheral circuit region can be decreased, and on-state current can be increased. In addition, the calculation method of the second Hf content percentage is similar to that of the first Hf content percentage. In the case of hafnium oxide ($HfO_2$, HfON), the Hf content percentage is 100 atm %.

In the present disclosure, in the memory cell region having the buried word line structure, the high dielectric constant film is used as the gate insulating film, and metal is used for the gate electrode. Therefore, the on-state current flowing through a channel can be increased, and the processing speed of the semiconductor device can be accelerated.

And, in the present disclosure, the first Hf content percentage of the high dielectric constant film in the memory cell region 100A having the buried word line structure is lowered, and a deterioration caused by the crystallization of the hafnium-containing compound in the gate insulating film is restrained. Therefore, the problems of the increase of the equivalent oxide thickness in the transistor of the memory cell region 100A, the increase of the gate leak current, and the increase in the threshold voltage are prevented, thus, the on-state current can be increased. Furthermore, a variation and the increase in the threshold voltage also can be restrained. Furthermore, a short circuit by the crystallization of the hafnium-containing compound also can be prevented. And, an ability of the transistor of the peripheral circuit region can be improved because the material having high relative dielectric constant is used without the crystallization of the hafnium-containing compound in the peripheral circuit region.

A manufacturing method of a semiconductor device according to the first exemplary embodiment of the present disclosure is explained. In FIGS. 5-22, schematic flowcharts to explain the method for manufacturing the semiconductor device according to the first exemplary embodiment of the present disclosure are shown. In FIGS. 5-22, FIG. A is a cross-sectional view of a region corresponding to FIG. 2, namely, a drawing corresponding to a cross-section along a line II-II of FIG. 1 in the memory cell region of the semiconductor device according to the first exemplary embodiment of the present disclosure. FIG. B is a cross-sectional view of a region corresponding to FIG. 3, namely, a drawing corresponding to a cross-section along a line III-III of FIG. 1 in the memory cell region of the semiconductor device according to the first exemplary embodiment of the present disclosure. FIG. C is a cross-sectional view of a region corresponding to FIG. 4, namely, a drawing corresponding to a cross-section in the peripheral circuit region of the semiconductor device according to the first exemplary embodiment of the present disclosure.

On a semiconductor substrate 101, a first mask 103 and a second mask 104 which have a pattern of a desired shape are formed. The first mask 103 may be, for example, a silicon oxide film. The second mask 104 may be, for example, a silicon nitride film. Then, in a memory cell region 100A and a peripheral circuit region 100B, the semiconductor substrate 101 is etched using the first mask 103 and the second mask 104 as masks, an element isolating groove 102 for forming of an element isolating film is formed (FIG. 5).

Figure 6:
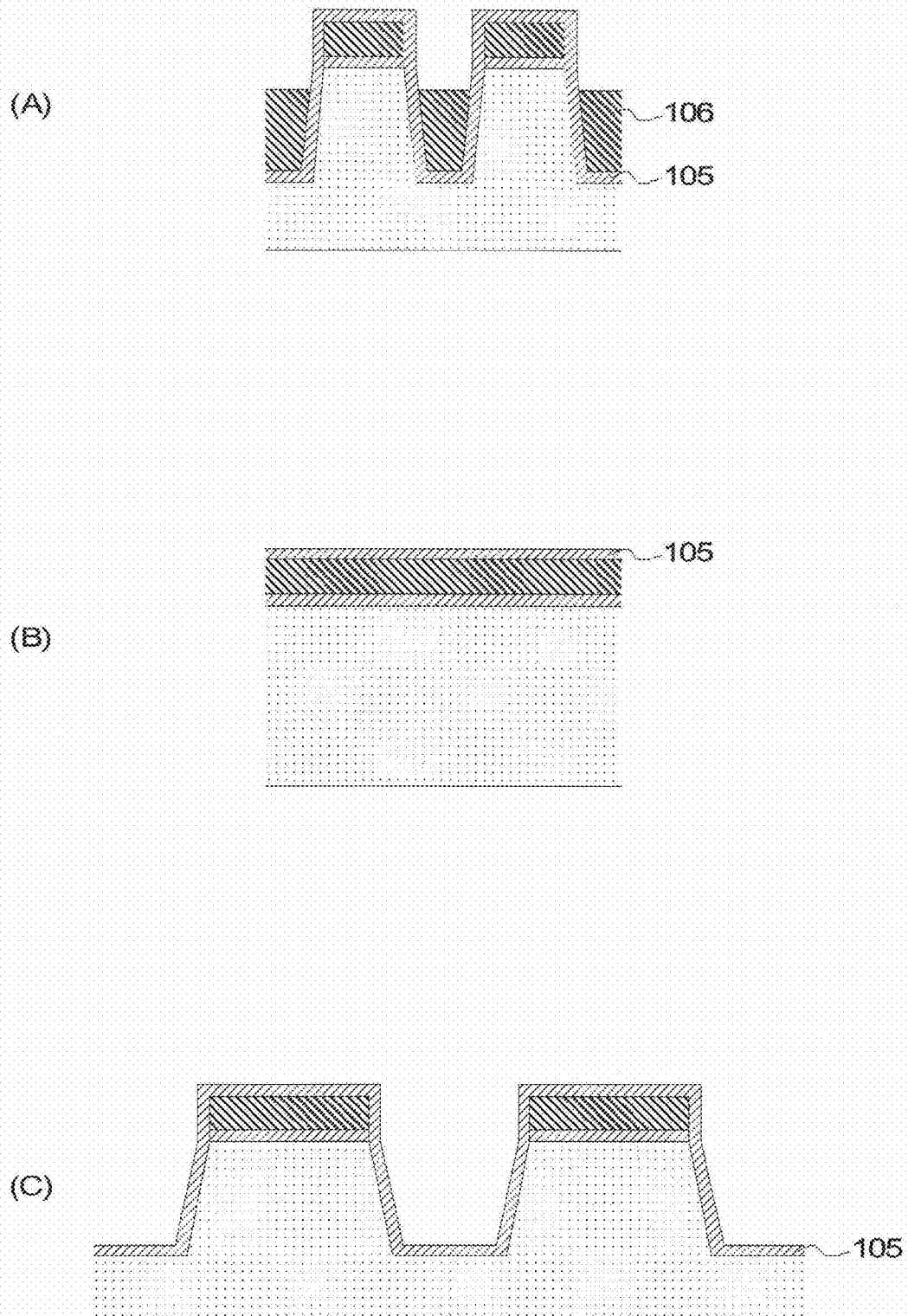
FIG. 6 is a schematic flowchart to explain a method for manufacturing a semiconductor device according to a first exemplary embodiment of the present disclosure.

Then, in the memory cell region 100A and the peripheral circuit region 100B, a first protective film 105 is formed on the entire surface. As the first protective film 105, for example, a silicon oxide film may be used. Then, a first element isolating film 106 is buried in the element isolating groove 102 of the memory cell region 100A, by covering the memory cell region 100A with an insulating film and performing an etchback (FIG. 6). As the first element isolating film 106, for example, a silicon nitride film may be used.

Then, a second element isolating film 107 is buried on the first element isolating film 106, and a third element isolating film 108 is buried in the element isolating groove 102 of the peripheral circuit region 100B. As the second element isolating film 107 and the third element isolating film 108, a silicon oxide film may be used. Then, the surface is flattened by a CMP (Chemical Mechanical Polishing) method or the like. On this occasion an exposed part of the first protective film 105 is removed (FIG. 7).

Figure 8:
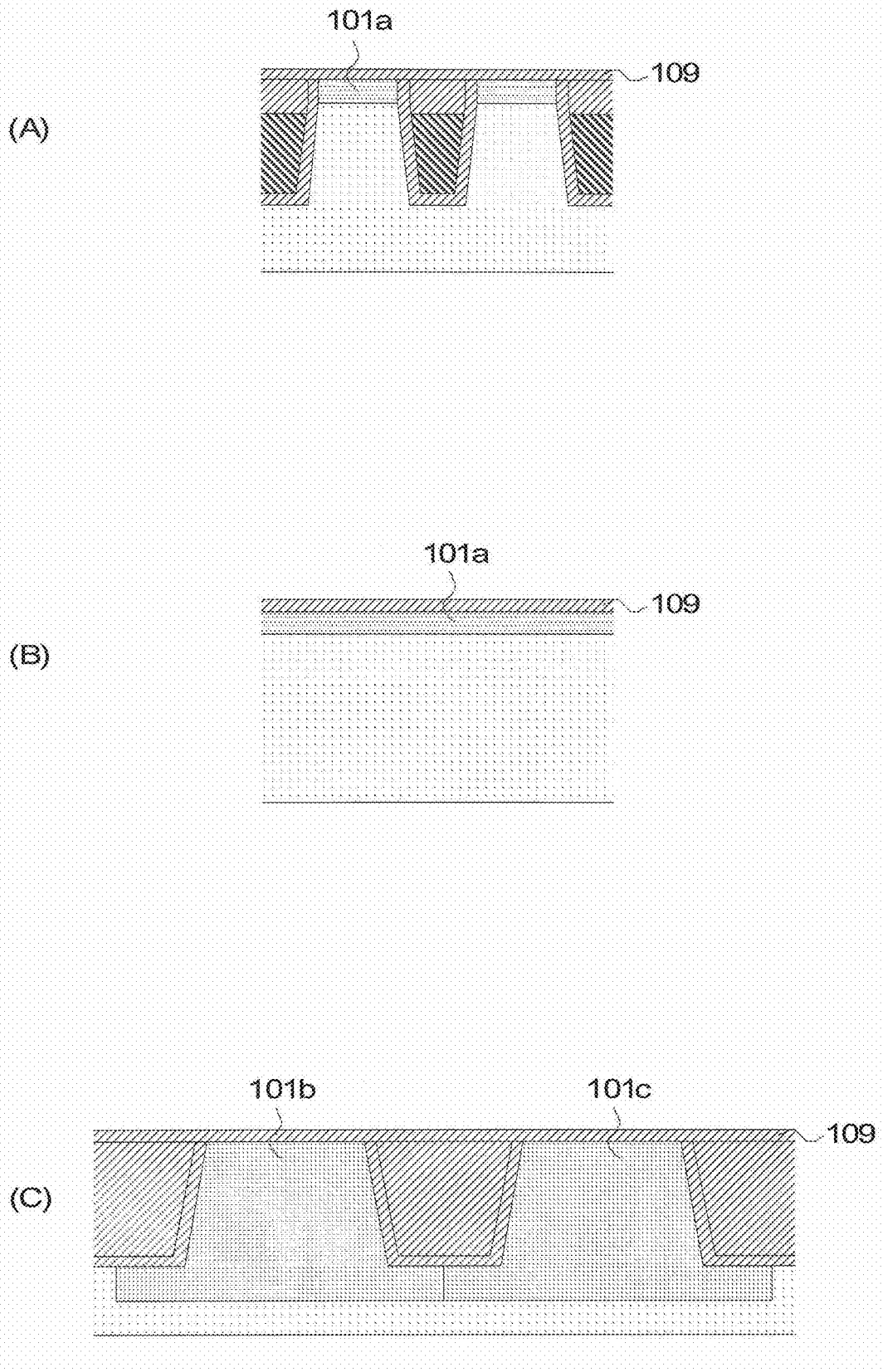
FIG. 8 is a schematic flowchart to explain a method for manufacturing a semiconductor device according to a first exemplary embodiment of the present disclosure.

Then, a second protective film 109 is formed on the entire surface of the memory cell region 100A and the peripheral circuit region 100B, after the first mask 103 and the second mask 104 are removed. For example, the second protective film 109 may be a silicon oxide film formed by a thermal oxidation. Then, an impurity diffusion layer 101a is formed by implanting an impurity into the semiconductor substrate 101 of the memory cell region 100A. For example, using phosphorus as the impurity, an n-type impurity diffusion layer 101a can be formed. And, in the peripheral circuit region 100B, the impurities are implanted, and a p-well 101b and an n-well 101c are formed, respectively (FIG. 8).

Then, in the memory cell region 100A, the semiconductor substrate 101 in the region to form a gate electrode groove in a later process is exposed, and a third mask 110 and a fourth mask 111 are laminated on the second protective film 109 (FIG. 9). As the third mask 110, for example, a silicon nitride film may be used. As the fourth mask 111, for example, a carbon film may be used.

Then, the semiconductor substrate 101 of the memory cell region 100A is etched using the third mask 110 and the fourth mask 111 as masks, a gate electrode groove 112 to form an buried gate electrode is formed. Then, the fourth mask 111 is removed (FIG. 10).

Figure 11:
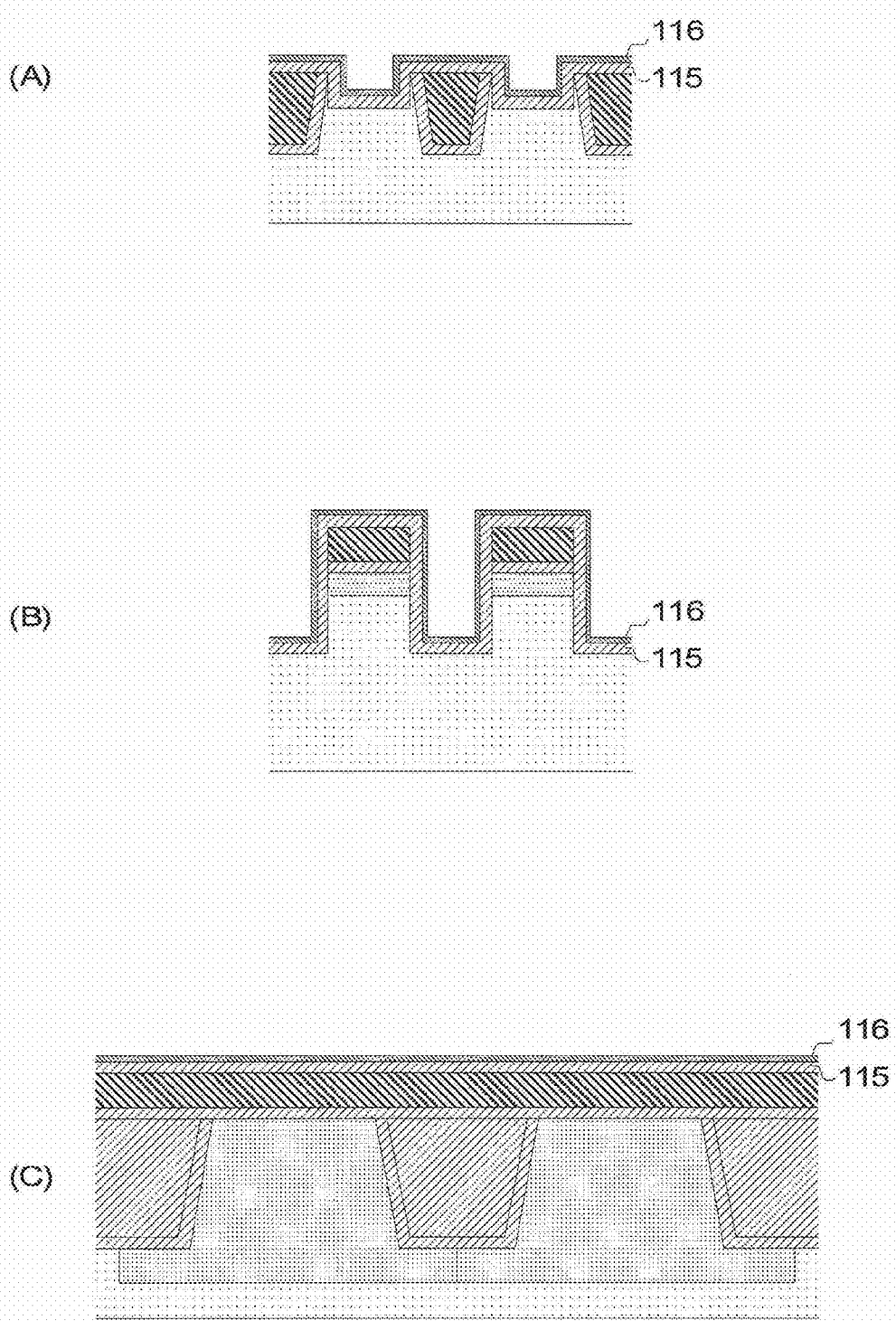
FIG. 11 is a schematic flowchart to explain a method for manufacturing a semiconductor device according to a first exemplary embodiment of the present disclosure.

Then, a second buried gate insulating film 115 and a first buried gate insulating film 116 are laminated on the entire surface of the memory cell region 100A and the peripheral circuit region 100B (FIG. 11). As described above, a first Hf content percentage of the first buried gate insulating film 116 is made lower than a second Hf content percentage of a high dielectric constant film to be formed in the peripheral circuit region 100B in a later process. An on-state current can be increased by using the high dielectric constant film as the gate insulating film.

Then, a first metal gate film 117 is formed in the entire surface of the memory cell region 100A and the peripheral circuit region 100B (FIG. 12). An on-state current can be increased by forming a gate electrode of metal not polysilicon.

Then, the first metal gate film 117 is formed and processed, and a first metal gate electrode 118 is formed in the gate electrode groove 112 of the memory cell region 100A (FIG. 13). In the peripheral circuit region 100B, the first metal gate film 117 is removed.

Then, an insulating film is buried in the gate electrode groove 112 (FIG. 14). For example, a buried cap insulating film 119 in a linear form is formed on the entire surface of the memory cell region 100A and the peripheral circuit region 100B, and a first insulating film 120 is buried in the gate electrode groove 112. As the buried cap insulating film 119, for example, a silicon nitride film may be used. As the first insulating film 120, a SOD (Spin-on Dielectrics) film may be used.

Then, a part of the insulating film above the impurity diffusion layer 101a is removed (FIG. 15). For example, in the memory cell region 100A, the upper parts of the buried cap insulating film 119 and the first insulating film 120 are removed by dry etching, and the third mask is removed by wet etching. And, in the peripheral circuit region 100B, the buried cap insulating film 119 and the first insulating film 120 are removed by dry etching, and the third mask is removed by wet etching. Furthermore, in the peripheral circuit region 100B, the first buried gate insulating film 116 and the second buried gate insulating film 115 are also removed.

Then, a second insulating film 121 acting as an interlayer insulating film and as a protective film for the memory cell region 100A is formed on the entire surface of the memory cell region 100A and the peripheral circuit region 100B (FIG. 16). As the second insulating film 121, for example, a silicon nitride film and a silicon oxynitride film may be used.

Then, in the peripheral circuit region 100B, the second protective film 109 and the second insulating film 121 are removed, for example, by wet etching (FIG. 17).

Figure 18:
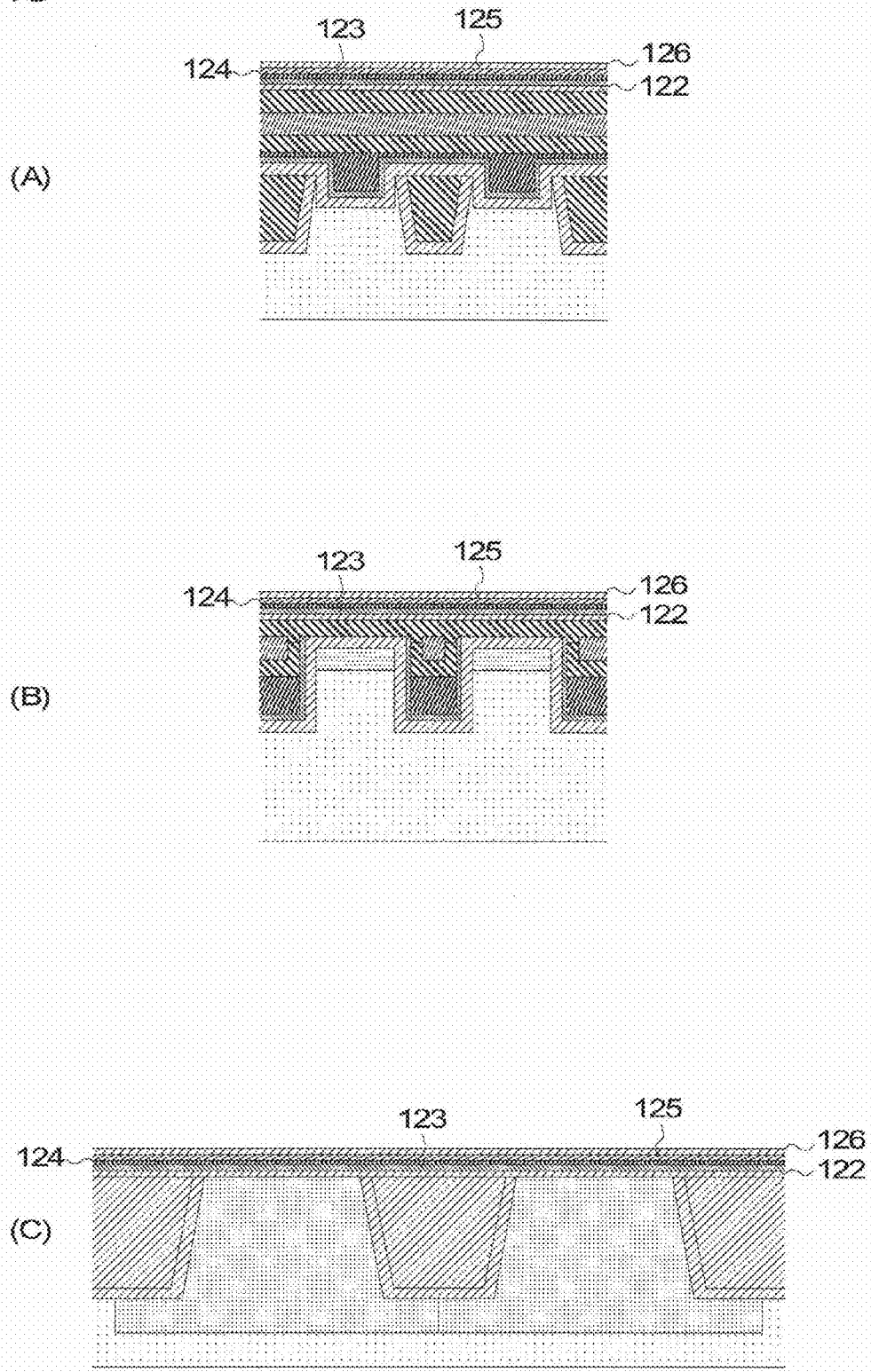
FIG. 18 is a schematic flowchart to explain a method for manufacturing a semiconductor device according to a first exemplary embodiment of the present disclosure.

Then, a third on-substrate gate insulating film 122, a first on-substrate gate insulating film 123, a second metal gate film 124, a first polysilicon film 125 and a third protective film 126 are laminated on the entire surface of the memory cell region 100A and the peripheral circuit region 100B (FIG. 18). As described above, the second Hf content percentage of the hafnium-containing compound in the first on-substrate gate insulating film 123 is made higher than the first Hf content percentage of the hafnium-containing compound in the first buried gate insulating film 116. It is preferred that the second Hf content percentage is made higher than the first Hf content percentage by 10 atm % or more. As the third on-substrate gate insulating film 122, for example, a silicon oxide film formed by thermal oxidation may be used. As the third protective film 126, for example, a silicon oxide film may be used.

Then, the second metal gate film 124, the first polysilicon film 125 and the third protective film 126 are left only on the p-well 101b of the peripheral circuit region 100B (FIG. 19). For example, After the p-well 101b is protected with a mask (not shown), the third protective film 126 may be removed by dry etching, and the first polysilicon film 125 and the second metal gate film 124 may be removed by wet etching.

Then, in a similar way to the process shown in FIG. 18, a second on-substrate gate insulating film 128, a third metal gate film 129, a second polysilicon film 130 and a fourth protective film 131 are laminated on the entire surface of the memory cell region 100A and the peripheral circuit region 100B in addition to on the n-well 101c of the peripheral circuit region 100B (FIG. 20). Therefore, ability of the transistor can be improved because a material having high relative dielectric constant can be used in the peripheral circuit region. As the fourth protective film 131, for example, a silicon oxide film and a silicon oxynitride film may be used.

Then, in a similar way to the process shown in FIG. 19, the third metal gate film 129, the second polysilicon film 130 and the fourth protective film 131 are left on the n-well 101c of the peripheral circuit region 100B (FIG. 21). For example, the fourth protective film 131, the second polysilicon film 130, the third metal gate film 129 and the second on-substrate gate insulating film 128 are removed after a region above the n-well 101c is protected with a mask (not shown). And, the third protective film 126 in the p-well 101b, the fourth protective film 131 in the n-well 101c and the third on-substrate gate insulating film 122 are removed. In this way, a layered body of the first on-substrate gate insulating film 123, the second metal gate film 124 and the first polysilicon film 125 is formed on the p-well 101b, and a layered body of the first on-substrate gate insulating film 123, the second on-substrate gate insulating film 128, the third metal gate film 129 and the second polysilicon film 130 is formed on the n-well 101c.

Then, in the memory cell region 100A, a part of the impurity diffusion layer 101a is exposed, and an impurity is implanted into the impurity diffusion layer 101a to form a high-concentration impurity diffusion layer 101d. Then, on the high-concentration impurity diffusion layer 101d, a layered body of a third polysilicon layer 134, a first conductive film 135 and a third insulating film 136 is formed. In the peripheral circuit region 100B, the layered body of the third polysilicon layer 134, the first conductive film 135 and the third insulating film 136 is formed, but the layered body of the third polysilicon layer 134, the first conductive film 135 and the third insulating film 136 is laminated on a gate stack on the p-well 101b and the n-well 101c (FIG. 22).

Then, a first interlayer insulating film 140, a contact pad 141, a capacitor 168, a second interlayer insulating film 145, a third interlayer insulating film 146 and a protective film 148 and so on are formed to form a semiconductor device (FIGS. 2-4).

When the third on-substrate gate insulating film 122 is formed, for example, by heat-treatment not less than 700 degrees Celsius, the memory cell region 100A is also exposed to thermal load. However, in the present disclosure, the hafnium-containing compound can be prevented from crystallizing by this heat-treatment because the first Hf content percentage of the hafnium-containing compound in the first buried gate insulating film 116 of the memory cell region 100A is made low. Therefore, the increase of the equivalent oxide thickness in the transistor of the memory cell region 100A, the increase of the gate leak current, and the increase in the threshold voltage can be prevented, and the on-state current can be increased. Furthermore, the increase of a variation in the threshold voltage can be restrained. Furthermore, a short circuit by the crystallization of the hafnium-containing compound also can be prevented. And, an ability of the transistor of the peripheral circuit region 100B can be improved because the material having high relative dielectric constant can be used without the crystallization of the hafnium-containing compound in the peripheral circuit region 100B.

For example, the present disclosure of the present application also includes an invention of "a semiconductor device, comprising: a first source electrode and a first drain electrode which are formed on a semiconductor substrate; and a first buried gate insulating film which is formed along an inner wall of a trench formed in the semiconductor substrate between the first source electrode and the first drain electrode and whose relative dielectric constant is higher than a relative dielectric constant of silicon oxide; and a buried gate electrode which is formed in the trench on the first buried gate insulating film, has metal and functions as a word line."

A further problem(s), object(s) and exemplary embodiment(s) of the present disclosure become clear from the entire of the present disclosure including claims and drawings.

The present disclosure, for example, can be applied to DRAM.

Preferred modes of each aspect are described below.

According to a preferred mode of the first aspect, the first Hf content percentage is lower than the second Hf content percentage.

According to a preferred mode of the first aspect, the first Hf content percentage is lower than the second Hf content percentage by 10 atm % or more.

According to a preferred mode of the first aspect, the hafnium-containing compound is not crystallized in the first buried gate insulating film even if the first buried gate insulating film is heat-treated at a temperature of 700 degrees Celsius or more.

According to a preferred mode of the first aspect, the first Hf content percentage is 10 atm % to 90 atm %.

According to a preferred mode of the first aspect, the semiconductor device further comprises a second buried gate insulating film between an inner wall of a trench of the semiconductor substrate and the first buried gate insulating film.

According to a preferred mode of the first aspect, the second buried gate insulating film comprises a silicon oxide film or a silicon oxynitride film.

According to a preferred mode of the first aspect, a part of the second transistors in the peripheral circuit region further has/have a second on-substrate gate insulating film having higher relative dielectric constant than that of silicon oxide on the first on-substrate gate insulating film.

According to a preferred mode of the first aspect, the second transistor further has a third on-substrate insulating film between the semiconductor substrate and the first on-substrate insulating film.

According to a preferred mode of the first aspect, the third on-substrate insulating film comprises a silicon oxide film or a silicon oxynitride film.

According to a preferred mode of the first aspect, the semiconductor device further comprises a cap buried insulating film which is buried in the trench of the semiconductor substrate on the buried gate electrode.

According to a preferred mode of the first aspect, the first on-substrate gate insulating film is formed above a surface of the semiconductor substrate.

According to a preferred mode of the second aspect, the first Hf content percentage is lower than the second Hf content percentage.

According to a preferred mode of the second aspect, the first Hf content percentage is lower than the second Hf content percentage by 10 atm % or more.

According to a preferred mode of the second aspect, the first Hf content percentage is 10 atm % to 90 atm %.

According to a third aspect of the present disclosure, there is provided a method of manufacturing a semiconductor device. The method comprises: forming a trench in a semiconductor substrate of a memory cell region; forming a first buried gate insulating film which comprises hafnium and whose relative dielectric constant is higher than a relative dielectric constant of silicon oxide, along an inner wall of a trench; forming a buried gate electrode on the buried gate insulating film; forming a first source electrode and a first drain electrode in the semiconductor substrate on both sides of the trench; forming a first on-substrate gate insulating film which comprises hafnium and whose relative dielectric constant is higher than a relative dielectric constant of silicon oxide, on a surface of the semiconductor substrate of the peripheral circuit region; forming an on-substrate gate electrode on the first on-substrate gate insulating film; and forming a second source electrode and a second drain electrode in the semiconductor substrate of both sides of the on-substrate gate electrode. The first buried gate insulating film and the first on-substrate gate insulating film are formed so that a first Hf content percentage, which is a content percentage of hafnium in the first buried gate insulating film, is different from a second Hf content percentage, which is a content percentage of hafnium in the first on-substrate gate insulating film.

According to a preferred mode of the third aspect, the first Hf content percentage is lower than the second Hf content percentage.

According to a preferred mode of the third aspect, the first Hf content percentage is made lower than the second Hf content percentage by 10 atm % or more.

According to a preferred mode of the third aspect, the first Hf content percentage is set in 10 atm % to 90 atm %.

According to a preferred mode of the third aspect, the first on-substrate gate insulating film is formed after forming the first buried gate insulating film.

According to a preferred mode of the third aspect, the method of manufacturing the semiconductor device further comprises forming a third on-substrate gate insulating film on the semiconductor substrate of the peripheral circuit region by heat-treatment after forming the first buried gate insulating film and before forming the first on-substrate gate insulating film.

According to a preferred mode of the third aspect, the heat-treatment is a heat-treatment of 700 degrees Celsius or more.

According to a fourth aspect of the present disclosure, there is provided a semiconductor device, comprising: a memory cell region having a first transistor, and a peripheral circuit region which is formed around the memory cell region and has a second transistor, on a semiconductor substrate. The first transistor has a first source electrode and a first drain electrode which are formed in the semiconductor substrate, a first buried gate insulating film which is formed along an inner wall of a trench formed in the semiconductor substrate between the first source electrode and the first drain electrode and whose relative dielectric constant is higher than a relative dielectric constant of silicon oxide, and a buried gate electrode which is formed in the trench on the first buried gate insulating film, comprises metal and functions as a word line.

According to a fifth aspect of the present disclosure, there is provided a method of manufacturing a semiconductor device, comprising: forming a trench in a semiconductor substrate of a memory cell region; forming a first buried gate insulating film which comprises a hafnium-containing compound and whose relative dielectric constant is higher than a relative dielectric constant of silicon oxide, along an inner wall of the trench; forming a buried gate electrode on the buried gate insulating film; forming a first source electrode and a first drain electrode in the semiconductor substrate on both sides of the trench; forming a first on-substrate gate insulating film which comprises a hafnium-containing compound and whose relative dielectric constant is higher than a relative dielectric constant of silicon oxide on a surface of the semiconductor substrate of the peripheral circuit region; forming an on-substrate gate electrode on the first on-substrate gate insulating film; and forming a second source electrode and a second drain electrode in the semiconductor substrate of both sides of the on-substrate gate electrode.

DEFINITIONS

In the present disclosure, the following definitions are applied.
(1) The term "on a (the) substrate" denotes "on", "above", "on the upper part of" or "in" the substrate, and should not be understood excluding the case of "in".
(2) Numerical values and numerical ranges disclosed and claimed herein are deemed to include all the intervening values and/or subranges, even if explicitly recited. The recitation of such intervening values is redacted merely for the simplicity in the disclosure.
(3) The singular form or articles such as "a" and "the" represents single and/or plural. This is also valid based on the priority disclosure in Japanese language which has inherently no difference between singular form and plural form of the noun.

The semiconductor device and manufacturing method thereof of the present disclosure are explained based on the above exemplary embodiments, but are not limited to the above exemplary embodiments, and may include any modification, change and improvement to the disclosed various elements (including each element of each claim, each element of each example, each element of each figure and others) within the scope of the present disclosure and based on the basic technical idea of the present disclosure. Within the scope of the claims of the present disclosure, various combinations, displacements and selections of disclosed elements (including each element of each claim, each element of each example, each element of each figure and others) are available.

What is claimed is:

1. A semiconductor device, comprising:
   a memory cell region having a first transistor, and a peripheral circuit region which is formed around said memory cell region and has a second transistor, on a semiconductor substrate; wherein
   said first transistor has:
   a first source electrode and a first drain electrode which are formed on said semiconductor substrate,
   a first buried gate insulating film which is formed along an inner wall of a trench formed in said semiconductor substrate between said first source electrode and said first drain electrode and whose relative dielectric constant is higher than a relative dielectric constant of silicon oxide, and
   a buried gate electrode which is formed in said trench on said first buried gate insulating film, comprises metal and functions as a word line; and
   said second transistor has:
   a second source electrode and a second drain electrode which are formed on said semiconductor substrate,
   a first on-substrate gate insulating film which is formed on a surface of said semiconductor substrate between said second source electrode and said second drain electrode and whose relative dielectric constant is higher than a relative dielectric constant of silicon oxide, and
   an on-substrate gate electrode which is formed on said first on-substrate gate insulating film and comprises metal;
   said first buried gate insulating film and said first on-substrate gate insulating film comprising a compound containing hafnium, wherein
   a first Hf content percentage, which is a content percentage of hafnium in said first buried gate insulating film, is different from a second Hf content percentage, which is a content percentage of hafnium in said first on-substrate gate insulating film.

2. The semiconductor device according to claim 1, wherein said first Hf content percentage is lower than said second Hf content percentage.

3. The semiconductor device according to claim 1, wherein said first Hf content percentage is lower than said second Hf content percentage by 10 atm % or more.

4. The semiconductor device according to claim 1, wherein said hafnium-containing compound in said first buried gate insulating film is not crystallized even if said first buried gate insulating film is heat-treated at a temperature of 700 degrees Celsius or more.

5. The semiconductor device according to claim 1, wherein said first Hf content percentage is 10 atm % to 90 atm %.

6. The semiconductor device according to claim 1, wherein said first buried gate insulating film comprises hafnium silicate.

7. The semiconductor device according to claim 1, wherein said first buried gate insulating film has a thickness ranging from 1 nm to 3.5 nm.

8. The semiconductor device according to claim 1, further comprising:
   a second buried gate insulating film between an inner wall of said trench of said semiconductor substrate and said first buried gate insulating film.

9. The semiconductor device according to claim 8, wherein said second buried gate insulating film comprises a silicon oxide film or a silicon oxynitride film.

10. The semiconductor device according to claim 1, wherein
    a part of said second transistors in said peripheral circuit region further has/have a second on-substrate gate insulating film having higher relative dielectric constant than that of silicon oxide on said first on-substrate gate insulating film.

11. The semiconductor device according to claim 10, wherein
    said second on-substrate gate insulating film comprises alumina.

12. The semiconductor device according to claim 1, wherein
    said second transistor further has a third on-substrate insulating film between said semiconductor substrate and said first on-substrate insulating film.

13. The semiconductor device according to claim 12, wherein
    said third on-substrate insulating film is a silicon oxide film or a silicon oxynitride film.

14. The semiconductor device according to claim 1, further comprising:
    a cap buried insulating film which is buried in said trench of said semiconductor substrate on said buried gate electrode.

15. The semiconductor device according to claim 1, wherein
    said first on-substrate gate insulating film is formed above a most upper surface of said semiconductor substrate.

16. The semiconductor device according to claim 1, wherein
    said first on-substrate gate insulating film comprises hafnium oxide or hafnium silicate.

17. A semiconductor device, comprising:
a first transistor and a second transistor on a semiconductor substrate; wherein
said first transistor includes:
a first gate insulating film which is formed along an inner wall of a trench formed in said semiconductor substrate and whose relative dielectric constant is higher than a relative dielectric constant of silicon oxide, and
a first gate electrode which is buried in said trench and formed on said first gate insulating film, and comprises metal; and
said second transistor includes:
a second gate insulating film which is formed on a most upper surface of said semiconductor substrate and whose relative dielectric constant is higher than a relative dielectric constant of silicon oxide, and
a second gate electrode which is formed on said second gate insulating film and comprises metal;
said first gate insulating film and said second gate insulating film comprising a compound containing hafnium, wherein
a first Hf content percentage, which is a content percentage of hafnium in said first gate insulating film, is different from a second Hf content percentage, which is a content percentage of hafnium in said second gate insulating film.

18. The semiconductor device according to claim 17, wherein
said first Hf content percentage is lower than said second Hf content percentage.

19. The semiconductor device according to claim 17, wherein
said first Hf content percentage is lower than said second Hf content percentage by 10 atm % or more.

20. The semiconductor device according to claim 17, wherein
said first Hf content percentage is 10 atm % to 90 atm %.

* * * * *